(12) United States Patent
Han et al.

(10) Patent No.: US 10,075,131 B2
(45) Date of Patent: Sep. 11, 2018

(54) ULTRA-BROADBAND SWITCHED INDUCTOR OSCILLATOR

(71) Applicant: International Business Machines Corporation, Armonk, NY (US)

(72) Inventors: Shu-Jen Han, Cortlandt Manor, NY (US); Keith A. Jenkins, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 15/133,281

(22) Filed: Apr. 20, 2016

(65) Prior Publication Data
US 2017/0310277 A1  Oct. 26, 2017

(51) Int. Cl.
*H03B 5/08* (2006.01)
*H03B 5/12* (2006.01)
*H03K 3/03* (2006.01)

(52) U.S. Cl.
CPC ......... *H03B 5/1278* (2013.01); *H03B 5/1212* (2013.01); *H03B 5/1243* (2013.01); *H03B 5/1268* (2013.01); *H03K 3/03* (2013.01)

(58) Field of Classification Search
CPC .......... H03K 3/03; H03B 1/04; H03B 5/1212; H03B 5/1278; H03B 5/1268; H03B 5/1243
USPC .............................................. 331/117 FE, 167
See application file for complete search history.

(56) References Cited

U.S. PATENT DOCUMENTS

| | | | |
|---|---|---|---|
| 2007/0040621 A1* | 2/2007 | Ngo | H03K 3/0315 331/57 |
| 2007/0103248 A1 | 5/2007 | Nakamura et al. | |
| 2011/0084771 A1* | 4/2011 | Nagaraj | H03B 5/1228 331/117 FE |
| 2011/0156829 A1 | 6/2011 | Wang | |
| 2012/0235759 A1 | 9/2012 | Pfeiffer et al. | |
| 2015/0031313 A1 | 1/2015 | Murphy et al. | |

FOREIGN PATENT DOCUMENTS

| | | |
|---|---|---|
| EP | 1424776 B1 | 6/2004 |
| EP | 1852968 A1 | 11/2007 |
| WO | 2007040429 A1 | 4/2007 |

OTHER PUBLICATIONS

Demirkan, M., et al., Design of Wide Tuning-Range CMOS VCOs Using Switched Coupled-Inductors, IEEE Journal of Solid-State Circuits, May 2008, pp. 1156-1163, vol. 43, No. 5.

(Continued)

*Primary Examiner* — Arnold Kinkead
(74) *Attorney, Agent, or Firm* — Scully, Scott, Murphy & Presser, P.C.; Abdy Raissinia, Esq.

(57) ABSTRACT

A voltage controlled oscillator (VCO) and a method of operating the VCO are disclosed. The VCO includes an inductor device, a capacitor device coupled in parallel with the inductor device through first and second nodes, and a pair of cross-coupled transistors coupled in parallel with the inductor device and the capacitor device through the first and second nodes. At least one of the pair of cross-coupled transistor includes a plurality of sub transistors coupled in parallel. The sub transistors are individually switchable to adjust current drive capability of each of the sub transistors. Each of the sub transistors includes a first gate and a second gate.

19 Claims, 14 Drawing Sheets

(56) References Cited

OTHER PUBLICATIONS

Zhang, J., et al., "21.5-to-33A GHz Voltage-Controlled Oscillator Using NMOS Switched Inductors in CMOS", IEEE Microwave and Wireless Components Letters, Jul. 2014, pp. 478-480, vol. 24, No. 7.

* cited by examiner

ULTRA-BROADBAND SWITCHED INDUCTOR OSCILLATOR

FIELD

The present disclosure generally relates to a voltage-controlled oscillator (VCO), and more specifically, to an ultra-broadband switched inductor oscillator.

BACKGROUND

In the era of big data, high speed wireless communication becomes essential. In many wireless communication devices, power consumption of a voltage controlled oscillator (VCO) becomes one of the more important performance issues.

The VCO includes an LC tank circuit, an active circuit, and a current source. The LC tank circuit includes an inductor circuit and a capacitor circuit coupled in parallel with the inductor circuit.

The active circuit includes a pair of cross-coupled transistors (e.g., NMOS transistors) and provides a "negative resistance" which is needed to compensate for the losses of the LC tank circuit to sustain oscillation of the VCO. The current source provides driving current for the cross-coupled transistors. The LC tank circuit generates a parasitic resistance Rp that represents the resistive loss of the tank inductors L and/or capacitors C. For oscillation to occur, the negative resistance Rneg (e.g., −1/Gm, here Gm is a transconductance of the pair of cross-coupled transistors) provided by the cross-coupled transistors should be greater than (in absolute value) than the parasitic resistance Rp.

The inductor and capacitor circuits in the LC tank circuit are reconfigured for frequency tuning and frequency tuning extension of the VCO, resulting in change of the parasitic resistance Rp therein, so that the negative resistance Rneg to offset (or compensate) the resistive loss due to the parasitic resistance Rp may be varied. If the negative resistance Rneg is not high enough (e.g., Rneg<Rp), the oscillation does not occur or signal quality (e.g., a signal-to-noise ratio, a signal bandwidth, or a phase noise level) is degraded.

On the other hand, if the negative resistance Rneg is too higher than a magnitude needed to compensate the resistive loss, power waste may occur in the VCO. Thus, the negative resistance Rneg needs to be optimized for a specific parasitic resistance Rp in the LC tank circuit, so that optimized driving current is provided to the cross-coupled transistors and thus, power consumption thereof is minimized.

SUMMARY

In one aspect there is provided a voltage controlled oscillator (VCO). The VCO includes a selectable inductor device, a capacitor device coupled in parallel with the inductor device through first and second nodes, and a pair of cross-coupled transistors coupled in parallel with the inductor device and the capacitor device through the first and second nodes. At least one of the pair of cross-coupled transistors includes a plurality of sub transistors coupled in parallel. The sub transistors are individually switchable to adjust current drive capability of each of the sub transistors. Each of the sub transistors includes a first gate and a second gate.

In another aspect there is provided a method of operating a VCO having an inductor circuit, a capacitor circuit, and a pair of cross-coupled transistors coupled in parallel with the inductor circuit and the capacitor circuit through first and second nodes. At least one of the cross-coupled transistors includes a plurality of sub transistors individually switchable, and each of the sub transistors has a first gate and a second gate. The method includes obtaining optimized numbers of switch-on sub transistors for respective combinations of inductor and capacitor configurations of the respective inductor and capacitor circuits, storing the obtained optimized numbers of switch-on sub transistors into a memory, receiving information of a specific combination of the inductor and capacitor configurations, selecting a specific number of switch-on sub transistors corresponding to the specific combination of the inductor and capacitor configurations out of the optimized numbers of switch-on sub transistors stored in the memory, and driving individually the second gates of the sub transistors with second gate voltages to switch on the selected optimized number of switch-on sub transistors. The obtaining of optimized numbers of switch-on sub transistors for respective combinations of inductor and capacitor configurations includes changing a number of switch-on sub transistors, measuring signal quality of a VCO output oscillation signal for the changed number of switch-on sub transistors, finding a minimum number of switch-on sub transistors with which the measured signal quality meets a predetermined criterion, and determining the minimum number of switch-on sub transistors as an optimized number of switch-on sub transistors for each of the combinations of inductor and capacitor configurations.

Further, in another aspect, there is provided a computer program product for performing a method of operating a VCO having an inductor circuit, a capacitor circuit, and a pair of cross-coupled transistors coupled in parallel with the inductor circuit and the capacitor circuit through first and second nodes. The computer program product is stored in a non-transitory computer-readable storage medium having computer readable program instructions. The computer readable program instructions are read and carried out by a processor. At least one of the cross-coupled transistors includes plurality of sub transistors individually switchable, and each of the sub transistors has a first gate and a second gate. The method includes obtaining optimized numbers of switch-on sub transistors for respective combinations of inductor and capacitor configurations of the respective inductor and capacitor circuits, storing the obtained optimized numbers of switch-on sub transistors into a memory, receiving information of a specific combination of the inductor and capacitor configurations, selecting a specific number of switch-on sub transistors corresponding to the specific combination of the inductor and capacitor configurations out of the optimized numbers of switch-on sub transistors stored from the memory, and driving individually the second gates of the sub transistors with second gate voltages to switch on the selected optimized number of switch-on sub transistors. The obtaining of optimized numbers of switch-on sub transistors for respective combinations of inductor and capacitor configurations includes changing a number of switch-on sub transistors, measuring signal quality of a VCO output oscillation signal for the changed number of switch-on sub transistors, finding a minimum number of switch-on sub transistors with which the measured signal quality meets a predetermined criterion, and determining the minimum number of switch-on sub transistors as an optimized number of switch-on sub transistors for each of the combinations of inductor and capacitor configurations.

DETAILED DESCRIPTION OF THE EMBODIMENTS

Figure 1A:
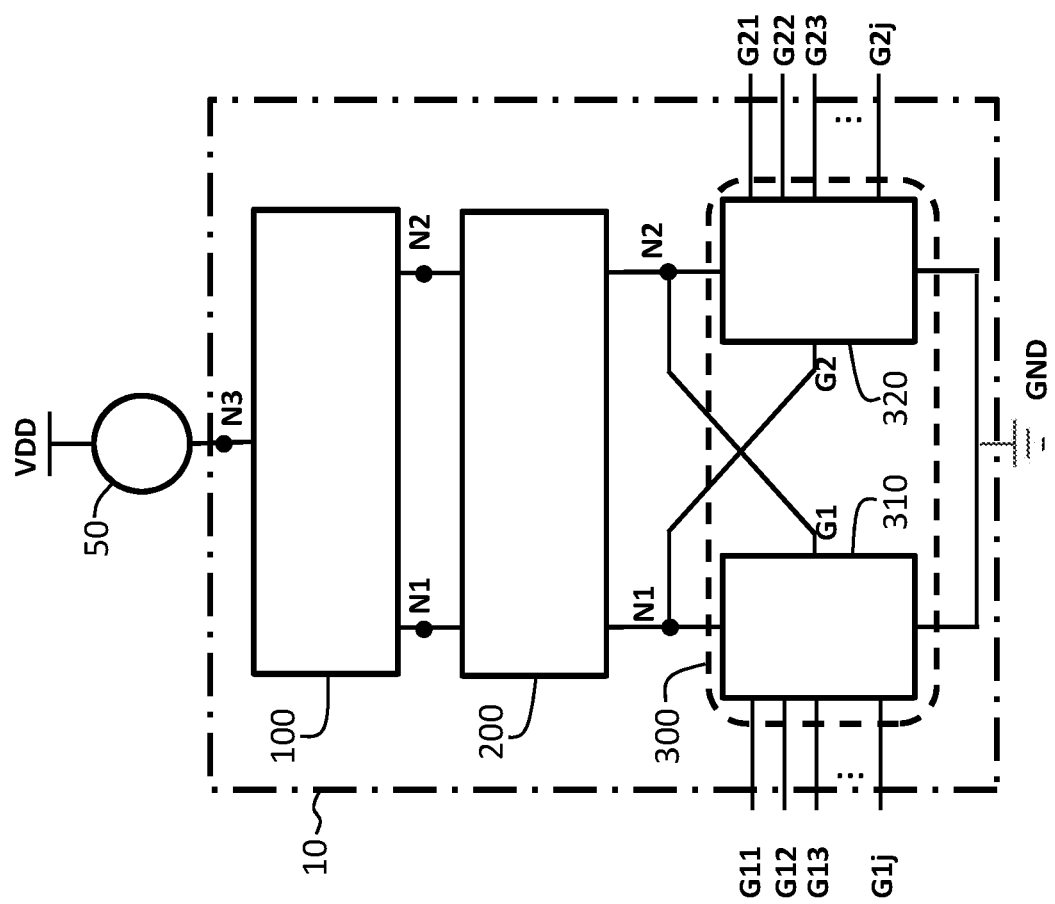
FIG. 1A is a block diagram of a voltage controlled oscillator (VCO) according to an exemplary embodiment of the present disclosure.

Like reference numerals may refer to like elements throughout the written descriptions and drawings.

FIG. 1A is a block diagram of a voltage controlled oscillator (VCO) 1 according to an exemplary embodiment of the present disclosure.

Referring to FIG. 1A, the VCO 1 includes a current source 50, an LC tank circuit, and an active circuit 300.

The LC tank circuit includes an inductor circuit 100 and a capacitor circuit 200. In an embodiment, the inductor circuit 100 may include selectable inductors in, e.g., sizes for frequency tuning extension, and the capacitor circuit 200 includes variable capacitors (e.g., diode varactors) whose capacitances are varied by applied voltages thereto for purposes of tuning the VCO output frequency over a specific tuning range. Exemplary embodiments of the inductor and capacitor circuits 100 and 200 will be described in more detail with reference to FIGS. 5 and 6, respectively.

The inductor circuit 100 may include a structure where at least one pair of inductors is differentially disposed.

The active circuit 300 includes a pair of cross-coupled transistors 310 and 320. The pair of cross-coupled transistors 310 and 320 provides a negative resistance Rneg to compensate for the resistive loss due to the LC tank circuit. The resistive loss may be generated due to the parasitic resistance Rp in the LC tank circuit.

Referring to FIG. 1A, the inductor circuit 100 and the capacitance circuit 200 are coupled in parallel through nodes N1 and N2. The capacitor circuit 200 is coupled in parallel with drains of the cross-coupled transistors 310 and 320 through the nodes N1 and N2.

Referring to FIG. 1A, the current source 50 is connected between a supply voltage VDD and the inductor circuit 100 through a node N3. Sources of the cross-coupled transistors 310 and 320 are connected to the ground GND. In an embodiment, a resistor (not shown) may be connected between the sources of the cross-coupled transistors 310 and 320 and the ground GND. The current source 50 provides driving current (or voltage) for the VCO 1. For example, the current source 50 may be implemented with a transistor such as a PMOS transistor.

Figure 1B:
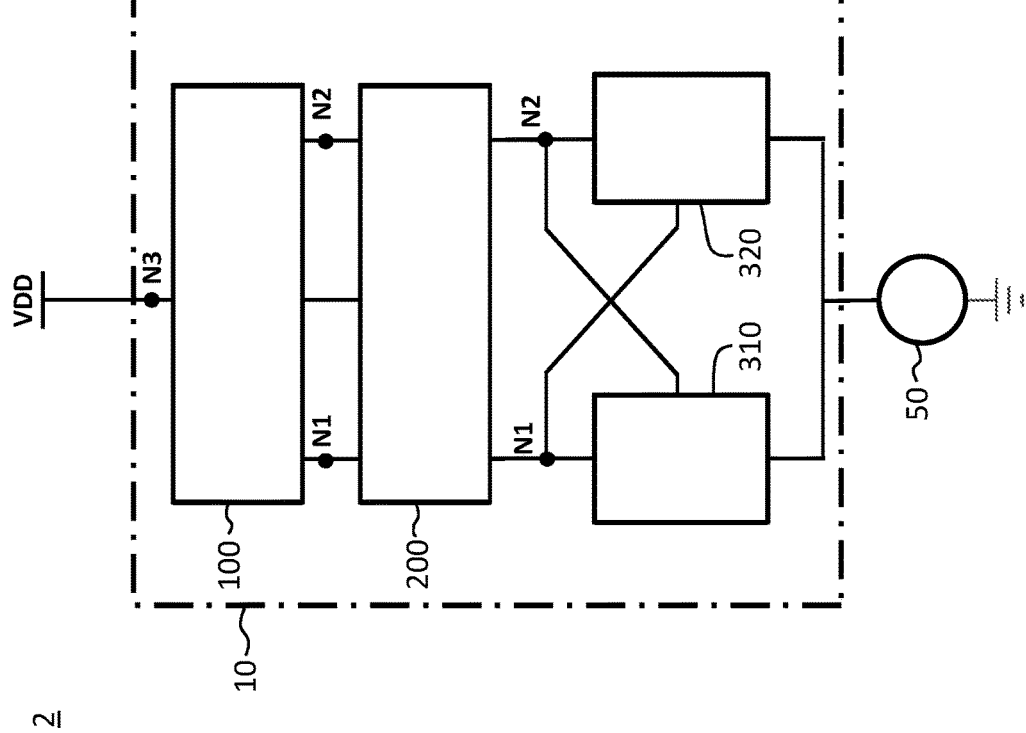
FIG. 1B is a block diagram of a VCO according to an exemplary embodiment of the present disclosure.

FIG. 1B is a block diagram of a VCO 2 according to an exemplary embodiment of the present disclosure.

In FIG. 1A, the inductor circuit 100, the capacitance circuit 200, and the cross-coupled transistors 310 and 320 constitutes a block 10. Referring to FIG. 1B, the VCO 2 has substantially same configuration as the VCO 1 of FIG. 1A except that the current source 50 is coupled to the sources of the cross-coupled transistors 310 and 320. Thus, duplicate description thereof will be omitted. In an embodiment, a resistor (not shown) may be connected between the inductor circuit 100 and the supply voltage VDD. In an embodiment, AC output oscillation signals may be picked up through the nodes N1 and N2 using output buffer circuits (not shown). Although not illustrated in FIGS. 1A and 1B, a pair of serially connected variable capacitors (e.g., diode varactors) may further be coupled in parallel with the capacitor circuit 200 through the nodes N1 and N2, and a control voltage is applied to a node between the two capacitors for a frequency tuning control.

Figure 1C:
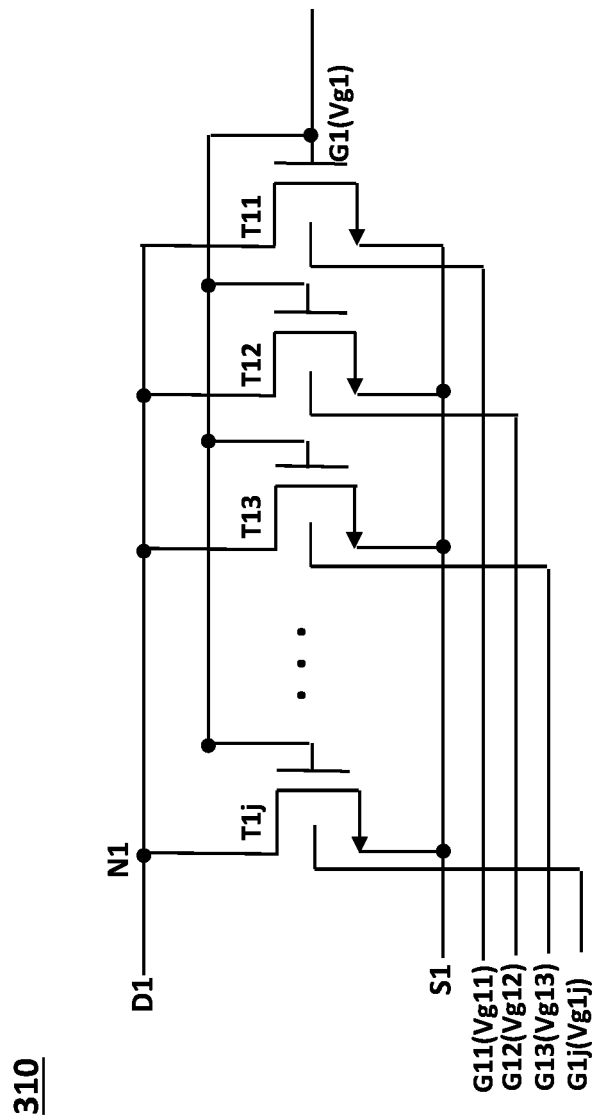
FIG. 1C is a circuit diagram of a transistor of FIG. 1A or 1B according to an exemplary embodiment of the present disclosure.
Figure 1D:
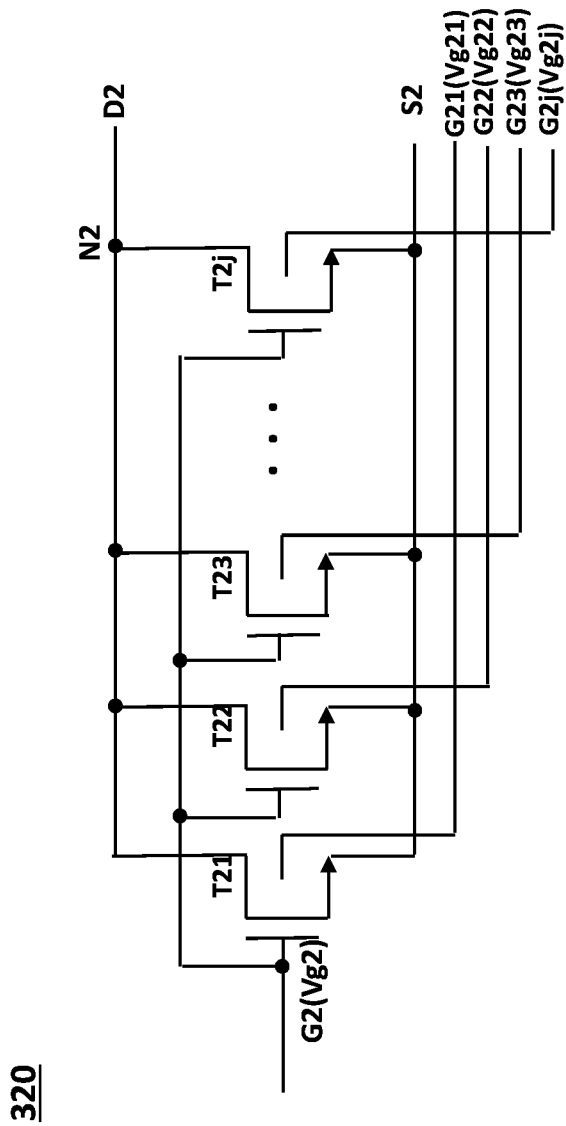
FIG. 1D is a circuit diagram of a transistor of FIG. 1A or 1B according to an exemplary embodiment of the present disclosure.
Figure 1E:
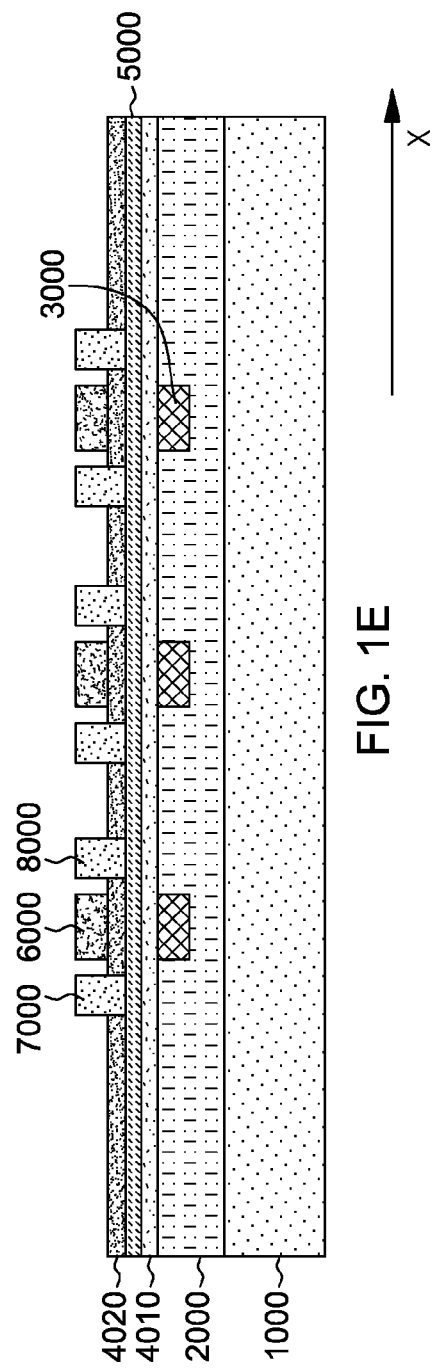
FIG. 1E is a cross-sectional view of a semiconductor structure of the transistor of FIG. 1C according to an exemplary embodiment of the present disclosure.
Figure 1F:
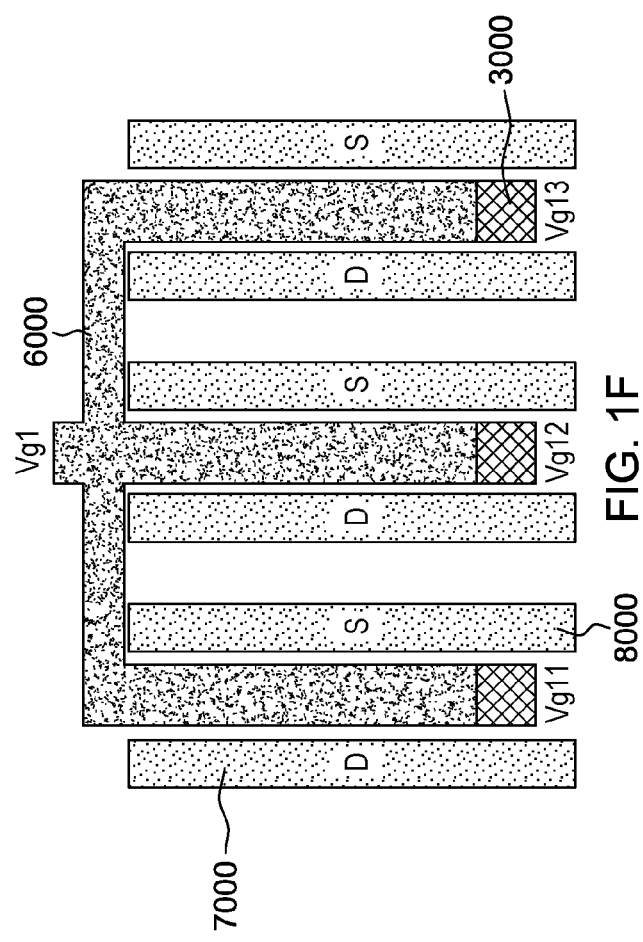
FIG. 1F is a top view of the semiconductor structure of the transistor of FIG. 1E according to an exemplary embodiment of the present disclosure.

FIG. 1C is a circuit diagram of a transistor 310 of FIG. 1A or 1B according to an exemplary embodiment of the present disclosure. FIG. 1D is a circuit diagram of a transistor 320 of FIG. 1A or 1B according to an exemplary embodiment of the present disclosure. FIG. 1E is a cross-sectional view of a semiconductor structure of the transistor 310 of FIG. 1C according to an exemplary embodiment of the present disclosure. FIG. 1F is a top view of the semiconductor structure of the transistor 310 of FIG. 1E according to an exemplary embodiment of the present disclosure.

Referring to FIGS. 1A to 1C, the transistor 310 includes a plurality of sub transistors T11 to T1j. Here, j is an integer more than one. Each of the sub transistors T11 to T1j has a drain, a source, and dual gates, e.g., a first gate G1 and a second gate G1k (here, k is an integer, 1≤k≤j). The sub transistors T11 to T1j are coupled in parallel with each other. For example, the sub transistors T11 to T1j share a common drain D1 and a common source S1. In addition, the sub transistors T11 to T1j share a common first gate G1; for example, the first gates G1 of the sub transistors T11 to T1j are commonly connected to the node N2 and are driven with a first gate voltage Vg1. For example, the first gate voltage Vg1 may be an AC oscillation signal OSC_in which is provided through the LC tank circuit and is input to the transistor 310. In addition, the respective second gates G11 to G1*j* of the sub transistors T11 to T1*j* are not directly connected to each other and are individually driven with second gates voltages Vg11 to Vg1*j*, respectively.

In FIGS. 1A to 1C, the common drain D1 of the transistor 310 is connected to the node N1 and the common source S1 of the transistor 310 is directly connected to the ground GND or is connected to the ground GND through a resistor (not shown). Referring to FIG. 1B, the common source S1 of the transistor 310 is connected to the current source 50.

In FIG. 1C, the reference character G1(Vg1) represents the common first gate G1 of the sub transistors T11 to T1*j* and a first gate voltage Vg1 applied to the first gate G1, and the reference character G1*k*(Vg1*k*) represents a second gate G1*k* and a second gate voltage Vg1*k* applied to the second gate G1*k*.

In an embodiment, the sub transistors T11 to T1*j* have substantially the same structures and parameters (e.g., gain, channel width, length) as each other. Exemplary embodiments of the present disclosure are not limited thereto, and the sub transistors T11 to T1*j* may have different structures and parameters from each other.

In an embodiment, each sub transistor T1*k* of the transistor 310 may be an NMOS transistor or a PMOS transistor.

In an embodiment, each sub transistor of the transistor 310 may be a carbon transistor having, not limited, to a channel formed using carbon nanostructures (e.g., carbon nanotubes (CNT) or graphene).

Referring to FIGS. 1A, 1B and 1D, the transistor 320 includes a plurality of sub transistors T21 to T2*j*, similar to the transistor 310 of FIG. 1C. The sub transistors T21 to T2*j* are coupled in parallel with each other. Each of the sub transistors T21 to T2*j* has dual gates, e.g., a first gate G2 and a second gate G2*k*. The sub transistors T21 to T2*j* share a common drain D2, a common source S2, and the common first gate G2. The drain D2 is connected to the node N2. The first gates G2 of the sub transistors T2*k* to T2*j* are commonly connected to the node N1 and are driven with a first gate voltage Vg2 corresponding to a voltage at the node N1. For example, the first gate voltage Vg2 may be an AC oscillation signal OSC_in which is provided through the LC tank circuit and is input to the transistor 320. In addition, the respective second gates G21 to G2*j* of the sub transistors T21 to T2*j* are not directly connected to each other and are individually driven with second gates voltages V21 to V2*j*, respectively.

In FIGS. 1A, 1B and 1D, the common drain D2 of the transistor 320 is connected to the node N2 and the common source S2 of the transistor 320 is directly connected to the ground GND or is connected to the ground GND through a resistor (not shown). Referring to FIG. 1B, the common source S2 of the transistor 320 is connected to the current source 50.

In FIG. 1D, the reference character G2(Vg2) represents the common first gate G2 of the sub transistors T21 to T2*j* and a first gate voltage VG2 applied to the first gate G2, and the reference character G2*k*(Vg2*k*) represents a second gate G2*k* and a second gate voltage VG2*k* applied to the second gate G2*k*.

In an embodiment, each sub transistor T2*k* of the transistor 320 may be an NMOS transistor or a PMOS transistor.

In an embodiment, each sub transistor T2*k* of the transistor 320 may be a carbon transistor having, not limited to, a channel formed using carbon nanostructures (e.g., carbon nanotubes (CNT) or graphene).

Exemplary cross-sectional view and top view of the transistor 310 will be described with reference to FIGS. 1E and 1F, respectively. The transistor 320 has substantially the same structure as the transistor 310. Thus, duplicate description of the transistor 320 will be omitted for the sake of simplicity.

FIG. 1E is a cross-sectional view of the transistor 310 of FIG. 1C according to an exemplary embodiment of the present disclosure. FIG. 1F is a top view of the transistor 310 of FIG. 1E according to an exemplary embodiment of the present disclosure.

Referring to FIG. 1E, the transistor 310 includes a substrate 1000 such as Si, SiGe, or the like, a first dielectric layer 2000 formed on the substrate 1000, a plurality of second gate electrodes 3000 formed in the first dielectric layer 2000, a second dielectric layer 4010 formed on the dielectric layer 2000, a carbon channel layer 5000 formed on the second dielectric layer 4010, a third dielectric layer 4020 formed on the carbon channel layer 5000, a plurality of first gate electrodes 6000 formed on the third dielectric layer 4020 in spaced apart relation. The drain electrodes 7000 and source electrodes 8000 are formed on the carbon channel layer 5000 on either side of the gate. The drain electrodes 7000, the gate electrodes 6000, and the source electrodes 8000 are alternately formed in a horizontal direction X using conventional semiconductor manufacturing and/or photolithographic techniques. In an embodiment, the first dielectric layer 2000 may be formed by thermally oxidizing the substrate 1000. In an embodiment, the first dielectric layer 2000 may be formed of one or more of various types of dielectric materials such as silicon dioxide ($SiO_2$) by depositing the dielectric materials using a chemical vapor deposition (CVD) or atomic layer deposition (ALD) method. In an embodiment, each of the second and third dielectric layers 4010 and 4020 may be a hi-k dielectric layer including high K materials such as aluminum oxide ($Al_2O_3$), zirconium silicate, hafnium silicate, hafnium silicon oxynitride, hafnium silicon nitride, lanthanum oxide ($La_2O_3$), hafnium oxide ($HfO_2$), zirconium oxide ($ZrO_2$), cerium oxide ($CeO_2$), or the like. The carbon channel layer 5000 includes a carbon nanostructure, such as carbon nanotubes or graphene, which serves as a channel of the transistor 310. In an embodiment, the carbon channel layer 5000 is formed by depositing or growing carbon materials, such as carbon nanotubes or graphene, on the first dielectric layer 2000. A group of the gate, drain, and source electrodes 6000, 7000 and 8000 corresponds to a single sub transistor (e.g., T1*k* or T2*k*).

The substrate 1000 may be formed of, e.g., silicon.

Referring to FIGS. 1E and 1F, the first gate electrodes 6000 are commonly connected and driven with the first gate voltage Vg1 through a conductor (not shown). On the other hand, the second gate electrodes 3000 are electrically isolated from each other to be individually driven with the second gate voltages Vg11 to Vg13. All drain electrodes are connected together in back-end-of-the-line (BEOL) and all source electrodes are connected in BEOL.

In FIG. 1F, only three groups of drain/gate/source of the transistor 310 for the sake of simplicity, however, exemplary embodiments of the present disclosure are not limited thereto.

Figure 2A:
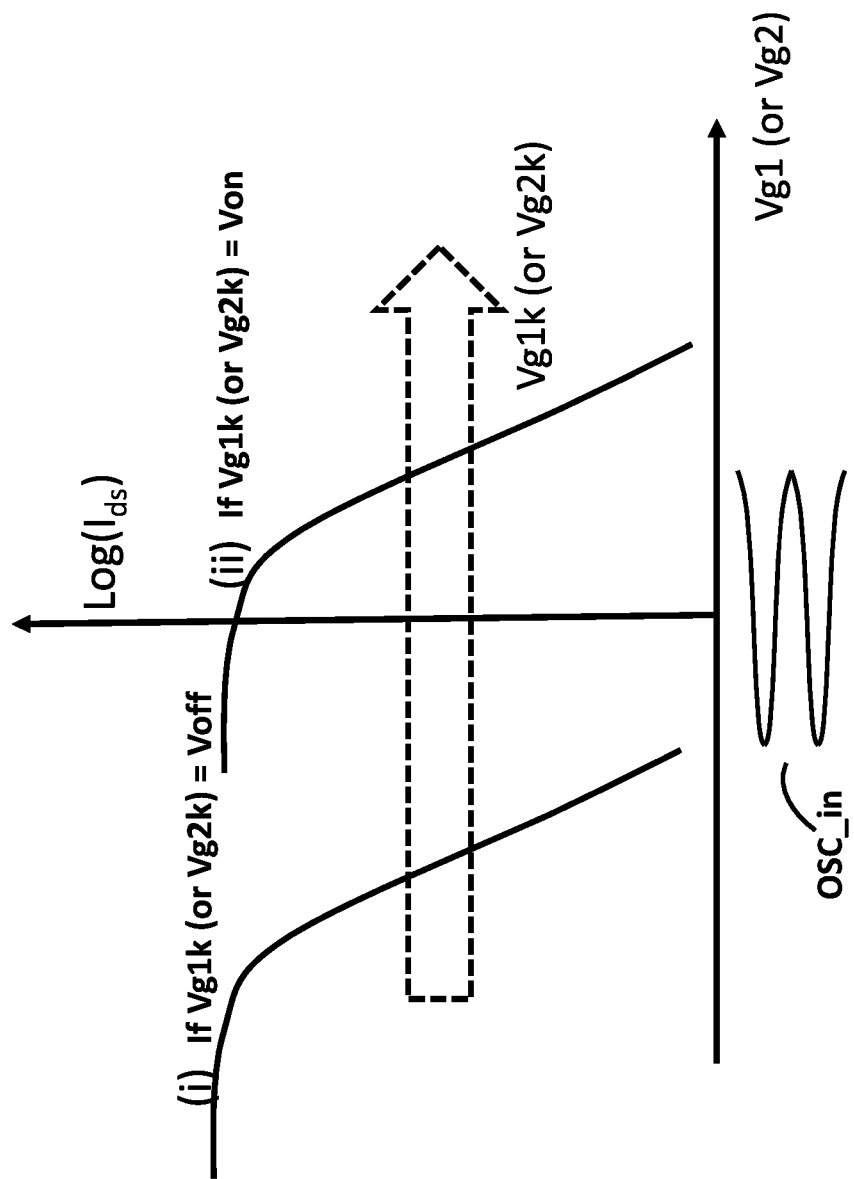
FIG. 2A illustrates an operation of a sub transistor of FIG. 1C or 1D according to an exemplary embodiment of the present disclosure.
Figure 2B:
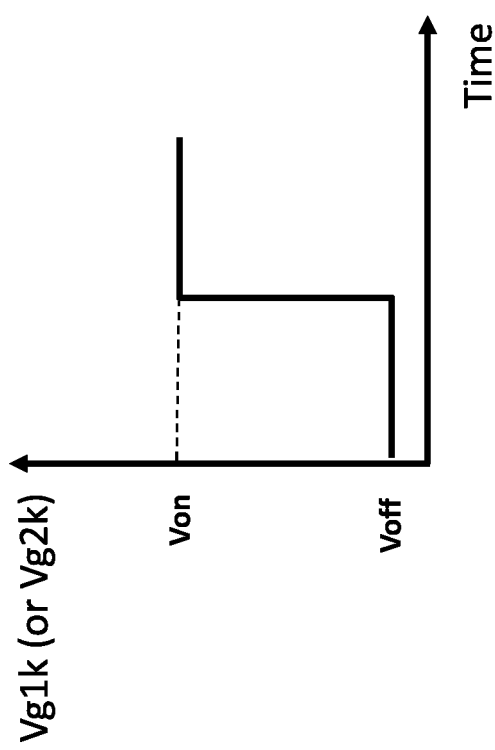
FIG. 2B illustrates a second gate voltage applied to a second gate of a sub transistor of FIG. 1C or 1D according to an exemplary embodiment of the present disclosure.

FIG. 2A illustrates an operation of a sub transistor of FIG. 1C or 1D according to an exemplary embodiment of the present disclosure. FIG. 2B illustrates a second gate voltage applied to a second gate of a sub transistor of FIG. 1C or 1D according to an exemplary embodiment of the present disclosure.

FIG. 2A depicts a V-I curve where a horizontal axis represents a voltage Vg1 (or Vg2) applied to the first gate G1 (or G2) of the sub transistor T1*k* (or T2*k*) and a vertical axis represents a current Ids (e.g., in a log scale) which flows from the drain D1 (or D2) to the source S1 (or S2) of the sub transistor T1k (or T2k). As described above, the sub transistors T11 to T1j (or T21 to T2j) share the common first gate G1 (or G2).

Referring to FIG. 2A, the first gate G1 (or G2) is driven with the first gate voltage Vg1 (or Vg2) which is an AC oscillation voltage signal OSC_in whose magnitude periodically oscillates along a time and the second gate G1k (or G2k) is driven with the second gate voltage Vg1k (or Vg2k). The second gate voltage Vg1k (or Vg2k) may be a switch-on voltage Von at which the sub transistor T1k (or T2k) is switched on or a switch-off voltage Voff at which the sub transistor T1k (or T2k) is switched off, as shown in FIG. 2B. For example, the first gate G1 (or G2) is used to receive the oscillation voltage signal OSC_in provided through the LC tank circuit and the second gate G1k (or G2k) is used for a switching control of the sub transistor T1k (or T2k). However, exemplary embodiments of the present disclosure are not limited thereto. For example, the second gate voltage Vg1k (or Vg2k) can be a certain voltage between the switch-on voltage Von and the switch-off voltage Voff for a fine driving voltage control on the sub transistor T1k (or T2k).

As illustrated in FIG. 2A, when the second gate voltage Vg1k (or Vg2k) is decreased to switch off a sub transistor T1k (or T2k), the V-I curve moves to the left of the graph (e.g., see (i) of FIG. 2A). Also, when the second gate voltage Vg1k (or Vg2k) is increased to switch on a sub transistor T1k (or T2k), the V-I curve moves to the right of the graph (e.g., see (ii) of FIG. 2A).

Thus, when the second gate G1k (or G2k) is driven by the second gate voltage Vg1k (or Vg2k) which is equal to or lower than the switch-off voltage Voff, the sub transistor T1k (or T2k) is switched off and the current flow through the sub transistor T1k (or T2k) is blocked. In addition, the second gate G1k (or G2k) is driven by the second gate voltage Vg1k (or Vg2k) which is equal to or higher than the switch-on voltage Von, the sub transistor T1k (or T2k) is switched on and the current flow through the sub transistor T1k is allowed.

By using double gate structure (e.g., the first and second gates G1 (or G2) and G1k (or G2k)), each of the sub transistors T11 to T1j (or T21 to T2j) can be individually switchable, so that the sub transistors T11 to T1j (or T21 to T2j) of the transistor 310 (or 320) are fully switched on, partially switched on, or fully switched off, resulting in change of an effective device width of the transistor 310 (or 320). For example, the number of switch-on sub transistors can be controlled by controlling the second gate voltages Vg11 to Vg1j (or Vg21 to Vg2j), and thus, an amount of driving current provided for the transistor 310 (or 320) can be controlled.

For example, the number of the switch-on sub transistors in the transistor 310 (or 320) is proportional to the number of the switch-on voltages out of the second gate voltages Vg11 to Vg1j (or Vg21 to Vg2j). For example, when the second gate voltages Vg11 to Vg1j (or Vg21 to Vg2j) are respectively "Von-Voff-Voff- . . . -Voff", the number of the switch-on sub transistors is one. When the second gate voltages Vg11 to Vg1j (or Vg21 to Vg2j) are respectively "Von-Von-Voff- . . . -Voff", the number of the switch-on sub transistors is two.

In an embodiment, the number of switch-on sub transistors in each of the cross-coupled transistors 310 and 320 is controlled according to a magnitude of the parasitic resistance Rp in the LC tank circuit.

For example, in a state where the VCO 1 or 2 operates while meeting an oscillation condition (e.g., |Rneg|≥Rp), when the magnitude of the parasitic resistance Rp is increased to exceed a negative resistance Rneg provided by the cross-coupled transistors 310 and 320, the number of switch-on sub transistors is increased to provide a higher negative resistance Reg, which increases driving current of the cross-coupled transistors 310 and 320. If the sub transistors are switched on such that the negative resistance Reg provided by the switch-on sub transistors is higher than the magnitude (of the negative resistance Rneg) needed for the compensation of the resistive loss in the LC tank circuit, power waste in the VCO 1 or 2 may occur. Thus, to prevent or minimize the power consumption in the VCO 1 or 2, the cross-coupled transistors 310 and 320 may be controlled to optimize the number of switch-on sub transistors for a specific parasitic resistance Rp in the LC tank circuit.

For example, the optimized number of switch-on sub transistors may be a minimum number of switch-on transistors enough for the compensation of the resistive loss.

In addition, in a state where the VCO 1 or 2 operates while meeting an oscillation condition (e.g., |Rneg|≥Rp), when the magnitude of the parasitic resistance Rp is decreased, the number of switch-on sub transistors is reduced to provide a lower negative resistance Reg. In this case, driving current provided for the cross-coupled transistors 310 and 320 can be reduced.

In an embodiment, the cross-coupled transistors 310 and 320 are controlled to switch on the minimum number of sub transistors enough to provide the negative resistance Rneg for the compensation of the certain resistive loss in the LC tank circuit.

In an embodiment, the transistors 310 and 320 are controlled to have different number of switch-on sub transistors from each other if necessary.

Figure 3:
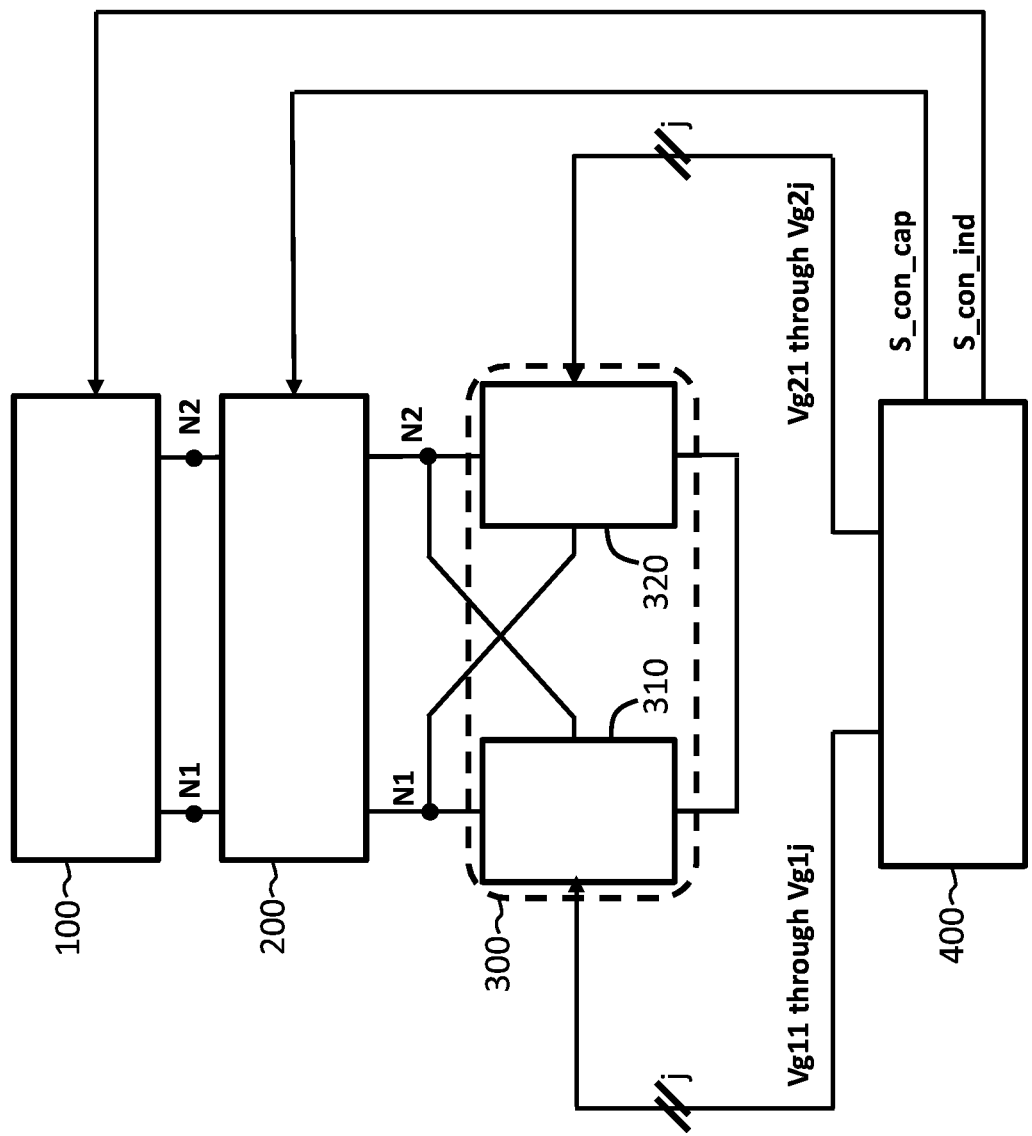
FIG. 3 illustrates a VCO controlled by a control device according to an exemplary embodiment of the present disclosure.

FIG. 3 illustrates a VCO 1 or 2 controlled by a control device 400 according to an exemplary embodiment of the present disclosure.

Referring to FIG. 3, the VCO 1 or 2 is controlled by the control device 400. The control device 400 is configured to provide a first control signal S_con_ind for controlling the inductor circuit 100, a second control signal S_con_cap for controlling the capacitor circuit 200, and a third control signal for a switching control of each sub transistor T1k or T2k in the cross-coupled transistors 310 and 320. The third control signal may include second gate voltages Vg11 to Vg1j for the transistor 310 and second gate voltages Vg21 to Vg2j for the transistor 320. In an embodiment, these second gates voltages Vg11 to Vg1j and Vg21 to Vg2j may be generated as a "j" digitalized bits of, e.g., logic 1 or 0, and which is configurable in parallel to control any second gate voltage of the VCO 1 or 2.

Figure 4:
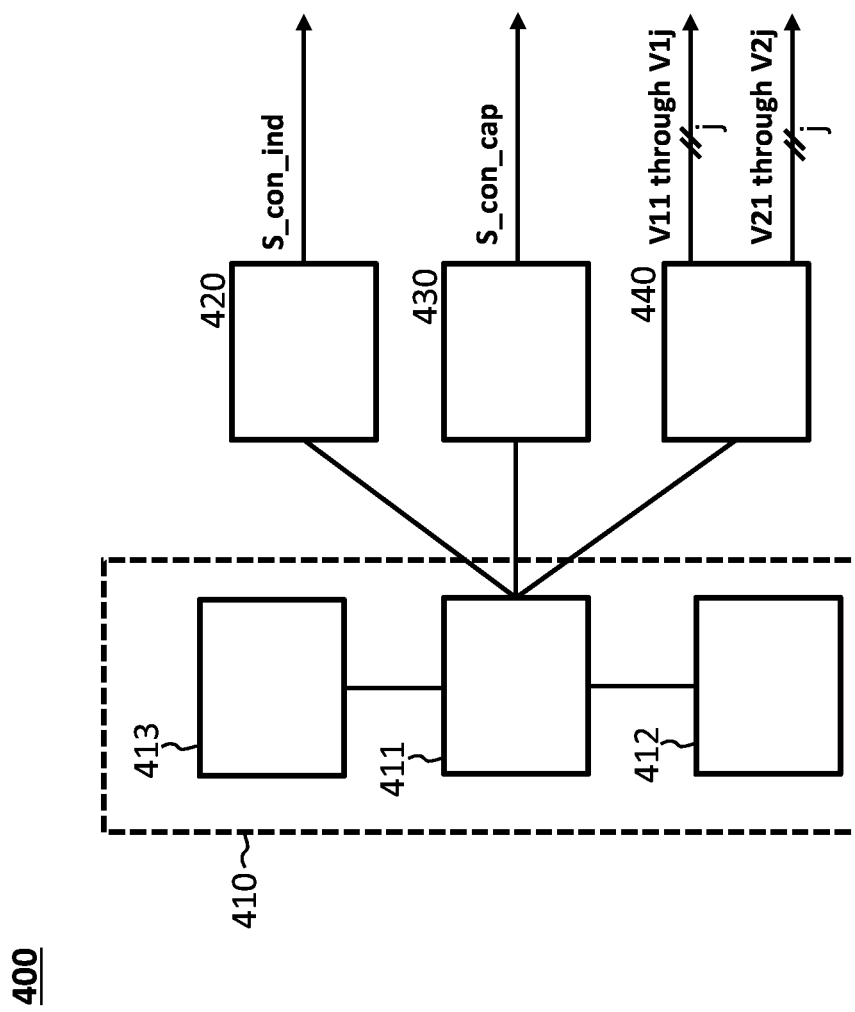
FIG. 4 is a block diagram of the control device of FIG. 3 according to an exemplary embodiment of the present disclosure.

FIG. 4 is a block diagram of the control device 400 of FIG. 4 according to an exemplary embodiment of the present disclosure.

Referring to FIG. 4, the control device 400 includes a computing system 410, an inductor control circuit 420 for providing the first control signal S_con_ind, a capacitor control circuit 430 for providing the second control signal S_con_cap, and a second gate control circuit 440 for providing the second gate voltages Vg11 to Vg1j and Vg21 to Vg2j. In an embodiment, at least one of the first and second control signals may be voltage signals.

The computing system 410 may include a processor 411 and an input/output (I/O) device 412.

In an embodiment, the processor 411 may receive an input corresponding to a desired oscillation output frequency through the I/O device 412 from a user or an external device (not shown), calculate corresponding inductance of the inductor circuit 100 and corresponding capacitance of the capacitor circuit 200 based on the input desired oscillation output frequency, and determine the first and second control signals based on the calculated inductance and capacitance. The processor 411 may further determine a parasitic resistance Rp corresponding to the calculated inductance and capacitances values and determine an optimized number of switch-on sub transistors enough to compensate for the resistive loss due to the resistance in the LC tank circuit. For example, the optimized number of switch-on sub transistors may be the minimum number of switch-on sub transistors in each of the transistors 310 and 320 which meets predetermined criteria to sustain oscillation of the VCO 1 or 2, as described with reference to FIGS. 2A and 2B. The computing system 410 (e.g., the processor 411) may control the second gate control circuit 440 to generate the second gate voltages Vg11 to Vg1j and Vg21 to Vg2j according to the optimized number of switch-on sub transistors. In an embodiment, the computing system 410 may further include a memory system 413 that stores a look-up table having information such as the minimum number of switch-on sub transistors for a certain parasitic resistance Rp or resistive loss in the LC tank circuit.

Figure 5:
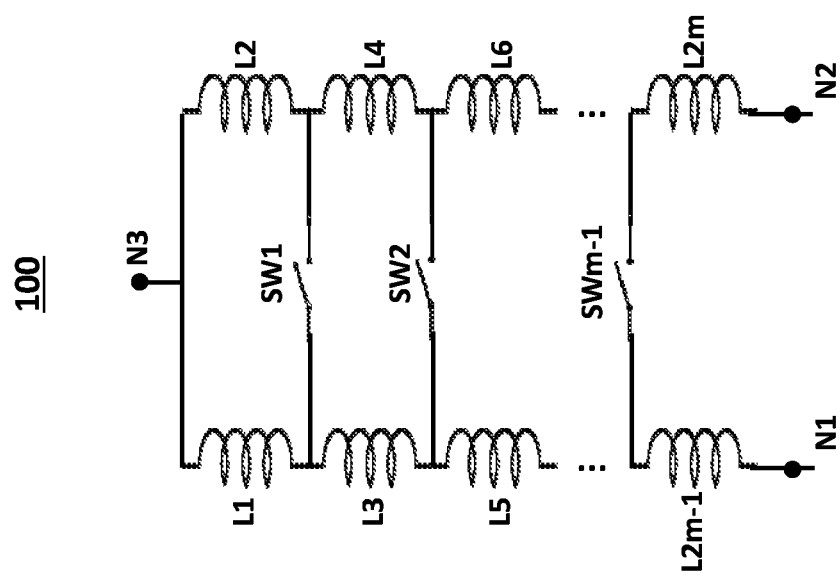
FIG. 5 is a circuit diagram of an inductor circuit according to a non-limiting exemplary embodiment of the present disclosure.

FIG. 5 is a circuit diagram of the inductor circuit 100 of FIG. 1A or 1B according to a non-limiting exemplary embodiment of the present disclosure.

Referring to FIG. 5, the inductor circuit 100 includes a plurality of inductors L1 to L2m and a plurality of switch devices SW1 to SWm−1. Here, m is an integer greater than one. The inductor circuit 100 is formed by cascading m/2 inductor loops with (m−1) switch devices SW1 to SWm−1 between adjacent sections. For example, certain voltage control signals (e.g., the first control signal S_con_ind) are applied to the switch devices SW1 to SWm−1 for an inductance control of the inductor circuit 100 or for a selection control of appropriate inductors or inductor configurations.

In an embodiment, each of the switch devices SW1 to SWm−1 may be a PMOS transistor.

Figure 6:
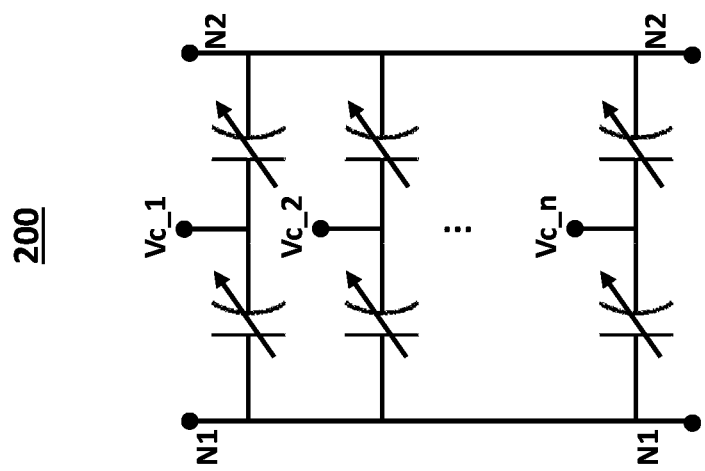
FIG. 6 is a circuit diagram of an capacitor circuit according to a non-limiting exemplary embodiment of the present disclosure.

FIG. 6 is a circuit diagram of the capacitor circuit 200 of FIG. 1A or 1B according to a non-limiting exemplary embodiment of the present disclosure.

Figure 7A:
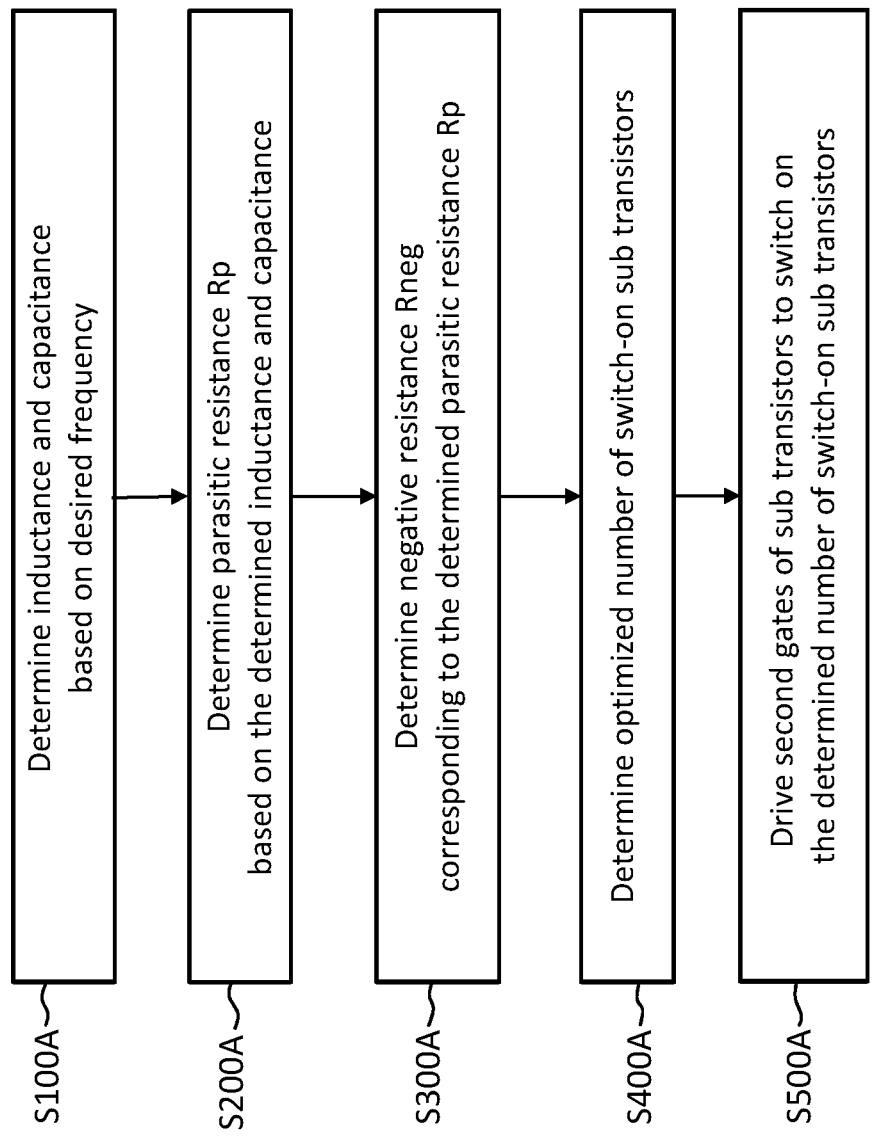
FIG. 7A is a flow chart illustrating a method for operating a VCO according to an exemplary embodiment of the present disclosure.

Referring to FIG. 6, the capacitance circuit 200 includes a plurality of varactor banks, each of which includes two varactors serially connected. Each of control voltages Vc1_1 to Vc_n is applied to a node between the two varactors in each varactor bank for a capacitance control in the capacitor circuit 200. The varactor banks are coupled in parallel through nodes N1 and N2. The second control signal S_con_cap may include the control voltages Vc1_1 to Vc_n. FIG. 7A is a flow chart illustrating a method of operating a VCO 1 or 2 according to an exemplary embodiment of the present disclosure.

Referring to FIG. 7A, the method of operating the VCO 1 or 2 according to an exemplary embodiment of the present disclosure includes: determining, by a control device (e.g., 400 of FIG. 3), a corresponding inductance of the inductor circuit 100A responsive to achieve a desired oscillation frequency and a corresponding capacitance of the capacitor circuit 200 in an operation S100; determining, by the control device, a parasitic resistance Rp based on the determined inductance and capacitance in an operation S200A; determining a negative resistance Rneg corresponding to the determined parasitic resistance Rp in an operation S300A; and determining, by the control device, an optimized number of switch-on sub transistors to compensate for the loss due to the parasitic resistance Rp in an operation S400A. In addition, the control device further controls the second gate control circuit 440 to drive the second gates of the sub transistors with the second gate voltages Vg11 to Vg1j and Vg21 to Vg2j according to the optimized number of switch-on sub transistors in an operation S500A.

Figure 7B:
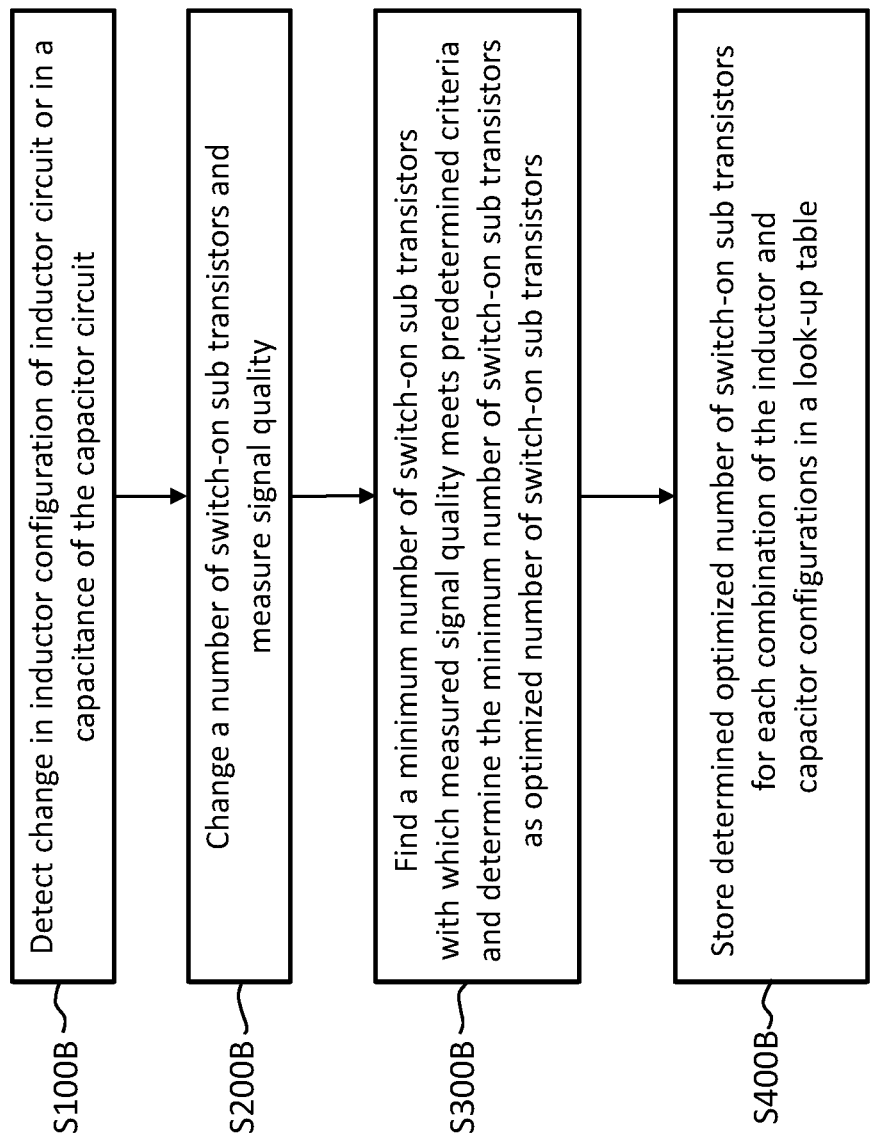
FIG. 7B is a flow chart illustrating a method for operating a VCO according to an exemplary embodiment of the present disclosure.
Figure 7C:
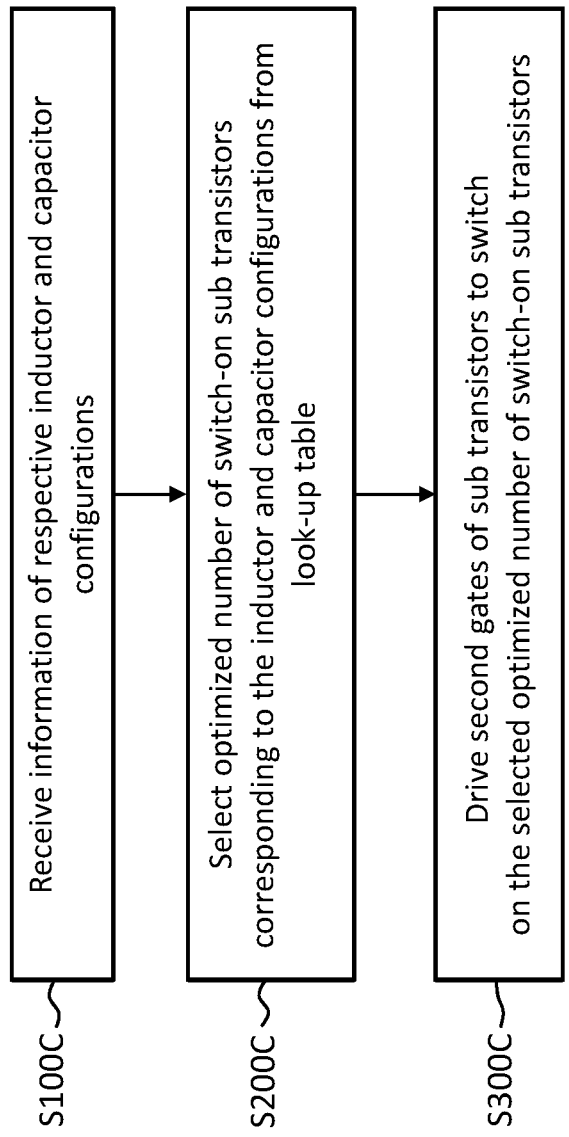
FIG. 7C is a flow chart illustrating a method for operating a VCO 1 or 2 according to an exemplary embodiment of the present disclosure.

FIG. 7B is a flow chart illustrating a method for determining an optimized number of switch-on sub transistors for each combination of inductor and capacitor configurations according to an exemplary embodiment of the present disclosure. FIG. 7C is a flow chart illustrating a method for operating a VCO 1 or 2 according to an exemplary embodiment of the present disclosure.

In an embodiment, the actual parasitic resistance Rp might not be known. In this case, the cross-coupled transistor circuit 300 may be tested to obtain information of an optimized number of switch-on sub transistors for each of various combinations of inductor configurations of the inductor circuit 100 and capacitor configurations of the capacitor circuit 200. In addition, the obtained optimized number of switch-on sub transistors for each combination of the inductor and capacitor configurations may be stored as a look-up table in the memory system 413.

Referring to FIG. 7B, the method of determining an optimized number of switch-on sub transistors for each combination of inductor and capacitor configurations according to an exemplary embodiment of the present disclosure includes: detecting, by a control device (e.g., 400 of FIG. 3), a change in an inductor configuration of the inductor circuit 100 or in a capacitance of the capacitor circuit responsive to achieve a desired oscillation frequency in an operation S100B; changing, by the control device, a number of switch-on sub transistors and measuring signal quality (e.g., a signal-to-noise ratio, a signal bandwidth, a phase noise level, or the like) of the AC output oscillation signal in an operation S200B; and finding, by the control device, a minimum number of switch-on sub transistors with which the measured signal quality of the AC output oscillation signal meets predetermined criteria and determining the minimum number of switch-on sub transistors as the optimized number of switch-on sub transistors in an operation S300B. The method may further include storing the determined optimized number of switch-on sub transistors for each combination of the inductor and capacitor configurations in the look-up table of the memory system 413 in an operation S400B. The predetermined criteria may include whether the signal quality of the AC oscillation signal is better (or higher or lower) than a predetermined value (e.g., a predetermined signal-to-noise ratio, a predetermined phase noise level, or the like).

Referring to FIG. 7C, in an embodiment, the method of operating the VCO 1 or 2 includes: receiving, by the control device, information of the respective inductor and capacitor configurations of the inductor and capacitor circuits 100 and 200 in an operation 100C, selecting an optimized number of switch-on sub transistors corresponding to the inductor and capacitor configurations from the look-up table of the memory system 413 in an operation 200C; and driving the second gates Vg11 to Vg1j and Vg21 to Vg2j to switch on the selected optimized number of switch-on sub transistors in an operation S300C. The computing system 410 may include a program module for operating the above-described VCO for performing the above-described method according to exemplary embodiments. For example, the program module may include routines, programs, objects, components, logic, data structures, or the like, for performing particular tasks or implement particular abstract data types. The processor 411 of the computing system 410 may execute instructions written in the program module to operate the above-described VCO or to perform the above-described method according to exemplary embodiments. The program module may be programmed into the integrated circuits of the processor (e.g., 411). In an exemplary embodiment of the present disclosure, the program module may be stored in a memory system 413 or in a remote computer system storage media.

The computing system 410 may include a variety of computing system readable media. Such media may be any available media that is accessible by the computing system 410, and it may include both volatile and non-volatile media, removable and non-removable media.

The memory system 413 can include computer system readable media in the form of volatile memory, such as random access memory (RAM) and/or cache memory or others. The computer system 410 may further include other removable/non-removable, volatile/non-volatile computer system storage media.

The present disclosure may be a circuit, a system, a method, and/or a computer program product. The computer program product may include a non-transitory computer readable storage medium (e.g., the memory system 413) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, or the like, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the computer system (e.g., 410) through any type of network, including a LAN or a WAN, or the connection may be made to an external computer (for example, through the Internet using an Internet Service Provider). In an exemplary embodiment of the present disclosure, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, circuits, systems, and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A voltage controlled oscillator (VCO) comprising:
   an inductor device including inductors;
   a capacitor device including capacitors, the capacitor device is coupled in parallel with the inductor device through first and second nodes; and
   a pair of cross-coupled transistors coupled in parallel with the inductor device and the capacitor device through the first and second nodes,
   wherein the pair of cross-coupled transistors includes first and second transistors,
   wherein at least one of the first and second transistors includes a plurality of sub transistors coupled in parallel,
   wherein the plurality of sub transistors are individually switchable to adjust current drive capability of each of the sub transistors,
   wherein each of the sub transistors includes a first gate and a second gate, and
   wherein a number of switch-on sub transistors out of the plurality of sub transistors is controlled according to a selected configuration in the inductor device or a capacitance of the capacitor device.

2. The VCO of claim 1, wherein the first gates of the plurality of sub transistors are commonly connected and driven with a first voltage.

3. The VCO of claim 1, wherein the plurality of sub transistors are individually switchable by individually driving the second gates with a plurality of second voltages.

4. The VCO of claim 3, wherein each of the second voltages is a voltage for switching on a corresponding sub transistor or a voltage for switching off the corresponding sub transistor.

5. The VCO of claim 1, wherein the first node is connected to a drain node of the first transistor and a gate node of the second transistor, and the second node is connected to a drain node of the second transistor and a gate node of the first transistor.

6. The VCO of claim 5, wherein a source node of the first transistor and a source node of the second transistor are commonly connected to a ground.

7. The VCO of claim 1, wherein each of the sub transistors is an NMOS transistor.

8. The VCO of claim 1, wherein each of the sub transistors has a channel formed using a carbon nanostructure.

9. The VCO of claim 1, further comprising:
   a control device providing control signals for reconfiguring the inductor device, the capacitor device, and the pair of cross-coupled transistors.

10. A method of operating a voltage controlled oscillator (VCO) including an inductor circuit, a capacitor circuit, and a pair of cross-coupled transistors coupled in parallel with the inductor circuit and the capacitor circuit through first and second nodes, wherein at least one of the cross-coupled transistors including a plurality of sub transistors individually switchable, and each of the sub transistors has a first gate and a second gate,
    wherein the method comprises:
    obtaining optimized numbers of switch-on sub transistors for respective combinations of inductor and capacitor configurations of the respective inductor and capacitor circuits;
    storing the obtained optimized numbers of switch-on sub transistors into a memory;
    receiving information of a specific combination of the inductor and capacitor configurations;
    selecting an optimized number of switch-on sub transistors out of the optimized numbers of switch-on sub transistors corresponding to the specific combination of the inductor and capacitor configurations out of the optimized numbers of switch-on sub transistors stored in the memory; and
    driving individually the second gates of the sub transistors with second gate voltages to switch on the selected number of switch-on sub transistors.

11. The method of claim 10, wherein the obtaining of optimized numbers of switch-on sub transistors for respective combinations of inductor and capacitor configurations includes:
    changing a number of switch-on sub transistors and measuring signal quality of a VCO output oscillation signal for the changed number of switch-on sub transistors; and
    finding a minimum number of switch-on sub transistors with which the measured signal quality meets a predetermined criterion and determining the minimum number of switch-on sub transistors as an optimized number of switch-on sub transistors for each of the combinations of inductor and capacitor configurations.

12. The method of claim 11, wherein the measuring of signal quality includes measuring at least one of a signal-to-noise ratio, a signal bandwidth, or a phase noise level.

13. The method of claim 10, wherein the first gates of the plurality of sub transistors are commonly connected and driven with a first voltage.

14. The method of claim 10, wherein each of the second voltages is a voltage for switching on a corresponding sub transistor or a voltage for switching off the corresponding sub transistor.

15. A computer program product stored in a non-transitory computer-readable storage medium having computer readable program instructions, the computer readable program instructions read and carried out by a processor for performing a method of operating a voltage controlled oscillator (VCO) including an inductor circuit, a capacitor circuit, and a pair of cross-coupled transistors coupled in parallel with the inductor circuit and the capacitor circuit through first and second nodes, wherein at least one of the cross-coupled transistors including a plurality of sub transistors individually switchable, and each of the sub transistors has a first gate and a second gate, wherein the method comprises:
obtaining optimized numbers of switch-on sub transistors for respective combinations of inductor and capacitor configurations of the inductor and capacitor circuits;
storing the obtained optimized numbers of switch-on sub transistors into a memory;
receiving information of a specific combination of the inductor and capacitor configurations;
selecting an optimized number of switch-on sub transistors corresponding to the specific combination of the inductor and capacitor configurations out of the optimized numbers of switch-on sub transistors stored in the memory; and
driving individually the second gates of the sub transistors with second gate voltages to switch on the selected number of switch-on sub transistors.

16. The computer program product of claim 15, wherein the obtaining of optimized numbers of switch-on sub transistors for respective combinations of inductor and capacitor configurations includes:
changing a number of switch-on sub transistors and measuring signal quality of a VCO output oscillation signal for the changed number of switch-on sub transistors; and
finding a minimum number of switch-on sub transistors with which the measured signal quality meets a predetermined criterion and determining the minimum number of switch-on sub transistors as an optimized number of switch-on sub transistors for each of the combinations of inductor and capacitor configurations.

17. The computer program product of claim 15, wherein the measuring of signal quality includes measuring at least one of a signal-to-noise ratio, a signal bandwidth, or a phase noise level.

18. The computer program product of claim 15, wherein the first gates of the plurality of sub transistors are commonly connected and driven with a first voltage.

19. The computer program product of claim 15, wherein each of the second voltages is a voltage for switching on a corresponding sub transistor or a voltage for switching off the corresponding sub transistor.

* * * * *